(12) United States Patent
Haidner et al.

(10) Patent No.: US 7,336,371 B1
(45) Date of Patent: Feb. 26, 2008

(54) APPARATUS AND METHOD FOR MEASURING THE WAVEFRONT OF AN OPTICAL SYSTEM (75) Inventors: Helmut Haidner, Aalen (DE); Markus Goeppert, Aalen (DE); Martin Schriever, Aalen (DE); Ulrich Wegmann, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 371 days.

(21) Appl. No.: 10/766,014

(22) Filed: Jan. 29, 2004

(51) Int. Cl.
*G01B 9/02* (2006.01)
(52) U.S. Cl. .................................... 356/515
(58) Field of Classification Search ............ 356/520, 356/515, 521, 512, 511, 489, 498
See application file for complete search history.

(56) References Cited

U.S. PATENT DOCUMENTS

| 6,650,399 | B2 | 11/2003 | Baselmans et al. | |
| 6,736,510 | B1 * | 5/2004 | Van Heugten | 351/221 |
| 2002/0001088 | A1 | 1/2002 | Wegmann et al. | |
| 2002/0030823 | A1 * | 3/2002 | Kobayashi et al. | 356/485 |
| 2004/0114150 | A1 * | 6/2004 | Wegmann et al. | 356/491 |

FOREIGN PATENT DOCUMENTS

DE 101 09 929 A1 11/2001

\* cited by examiner

*Primary Examiner*—Hwa (Andrew) Lee
(74) *Attorney, Agent, or Firm*—Sughrue Mion, PLLC (57) ABSTRACT

A device and a method for wavefront measurement of an optical system (7), in particular by an interferometric measurement technique. A dynamic range correction element (12, 12a) is arranged in the beam path upstream of the detector arrangement (11) and is designed such that the variation in the spatially dependent characteristic of a phase of the wavefront forming the interference pattern is kept below a prescribed limit value throughout a detection area. In addition or as an alternative, a set of several diffraction structures of different period length can be used with a shearing interferometry technique and/or a set of several pairs of a reference pinhole and a signal passage opening with different hole spacings can be used with a point diffraction interferometry technique for different sub-areas of the detection area. A remaining distortion error can be taken into account by determining a corresponding distortion transformation and applying the inverse distortion transformation.

14 Claims, 5 Drawing Sheets

APPARATUS AND METHOD FOR MEASURING THE WAVEFRONT OF AN OPTICAL SYSTEM

BACKGROUND OF THE INVENTION

1. Field of the Invention

The invention relates to a device and a method for wavefront measurement of an optical system, in particular using an interferometric measurement technique.

2. Description of the Related Art

Such devices and methods are used, in particular, to determine the imaging quality of high accuracy imaging optics. An important application is the high accuracy measurement of the imaging behaviour of projection objectives in microlithography projection exposure machines. As an alternative to the use of a separate measuring site, it is possible in this case to provide to undertake the wavefront measurement of the objective in situ, that is to say in its installed state in the exposure machine. The measurement device is then integrated for this purpose in the exposure machine. The measurement of the objective is preferably performed at an operating wavelength, that is to say at that wavelength used by the exposure ma-chine in exposure mode. Such a measuring device is therefore also de-noted as an operational interferometer (OI). In a narrower sense, this term is used, in particular, for such measuring devices operating at operational wavelengths and with the aid of lateral shearing interferometry.

Such an OI is disclosed, for example, in the Laid-Open Patent Application DE 101 09 929 A1 in an implementation denoted as standard OI (S-OI). For the purpose of wavelength measurement of the objective, devices of this type of standard OI comprise an object-side mask structure element which is preferably to be arranged in or near an object plane of the objective, an image-side diffraction structure element preferably to be arranged in or near an image plane of the objective, a detector, for example a CCD camera, in the beam path downstream of the diffraction structure element, and a detector-side imaging optical system, typically with a microscope objective, between the diffraction structure element and detector. The diffraction structure element typically has a diffraction grating structure which is periodic in one or more directions, and the mask structure element functions as a so-called coherence mask and has for this purpose a suitable mask structure, which is mostly likewise periodic. The detector-side imaging optics images the diffraction structure, or the mask structure imaged thereon by the objective, into the far field, and thus images a pupil of the objective onto the detector.

Used as an alternative to the standard OI is a so-called compact OI (C-OI) which operates without the detector-side imaging optics and uses its detector to pick up the generated wavefront interference pattern in the quasi-far field. For this purpose, the detector surface is placed at a short spacing downstream of the diffraction structure element, or the radiation coming from this element is passed on to the camera surface with the aid of a so-called face plate, of which the entrance surface is placed at a short spacing downstream of the diffraction structure element.

In both the variants of standard OI (S-OI) and compact OI (C-OI), the OI does not directly detect the wavefront coming from the measuring optical system, but detects the first spatial derivatives thereof. The variation thereof, that is to say specifically the magnitude of the second partial spatial derivatives of the wavefront, determines and limits the measurement range, that is to say the dynamic range, in which the measuring device can be used. This is influenced substantially by the aberrations of the measuring optical system and, in the case of the shearing interferometry technique, by the so-called shearing distance. This can lead to a severe limitation of the measurement range, specifically when measuring optical systems in the unadjusted state, or when measuring system parts or modules of optical systems having relatively large aberrations, that is to say the phase modulation of the wavefront to be detected exceeds a certain upper limit such that the interference pattern can no longer be detected by the detector with the desired resolution over the entire active detector surface if no counter measures are taken.

It is true that consideration is given as counter measures to increasing the spatial resolution of the detector or the number of detector pixels, for example of a CCD camera, and to reducing the shearing distance in the lateral shearing interferometry technique by selecting larger period lengths of the diffraction/mask structures. However, the detector resolution is limited by the minimum size of detector pixels, and the selection of a smaller shearing distance throughout the entire detection area, that is to say the entire detected cross section of the radiation measuring the optical system, leads in cases with very irregular variation in the wavefront to the fact that the signal-to-noise ratio becomes very small for a majority of the detector pixels, and it is therefore only a small portion of the detector pixels which make an effective contribution to the wavefront measurement with good reproducibility.

Whereas, owing to the detector-side imaging optics, the S-OI images the interference pattern into the far field in a sinusoidally corrected fashion, that is to say aplanatically, onto the detector surface, in the case of the C-OI the interference pattern is imaged onto the detector surface into a plane virtually close to the far field owing to spreading in free space. In the case of a measuring optical imaging system such as a microlithography projection lens, this means that the first spatial derivative of the wavefront in a pupil of the imaging system is substantially undistorted with the S-OI, whereas with the C-OI it is already in principle not imaged in a sinusoidally corrected fashion and therefore is imaged with a corresponding distortion error. Depending on the detection system used, this can also be affected by a certain, slight distortion error. Since the wavefront measurement typically includes the measure of using the detected interference pattern to deduce the wavefront characteristic in the measured optical system and, in particular, in a pupil plane of a measured optical imaging system, in order to determine the beam guidance quality or imaging quality of the optical system, there is a need for measures which give suitable consideration to distortion errors.

In this context, Patent Specification U.S. Pat. No. 6,650,399 B2 discloses an interferometric pinhole measurement technique of calibrating a distortion error by calculating a corresponding distortion transformation by means of a so-called focal stepping, that is to say by means of a sequence of measurement operations in various axial positions of the pinhole and detector, and thus various focal positions.

Fizeau interferometers with C optics are also in use for wavefront measurement of optical systems, but are generally incapable of very compact design and are relatively susceptible to environmental influences. Moreover, their coherent light source mostly results in so-called speckled effects.

The invention is based on the technical problem of providing a device and a method which can be used to measure optical systems and, in particular, modules or subsystems of optical systems with a relatively low out-lay in a very accurate fashion by means of a wavefront measurement technique.

SUMMARY OF THE INVENTION

In accordance with a first aspect, the invention solves this problem by providing a device for wavefront measurement of an optical system which comprises a detector arrangement in the beam path downstream of the optical system for detecting a generated interference pattern of a wavefront within a detection area, and a dynamic range correction element, in the beam path upstream of the detector arrangement which keeps a variation in a spatially dependent characteristic of a phase of the wavefront generating the interference pattern below a prescribable limit value throughout the detection area. Here, the term detection area generally means a system or beam cross section detected by the measurement, and this corresponds to the pupil in the case of measuring optical systems with a pupil. This correction element increases the dynamic range of the detector arrangement such that it is also possible to measure optical systems or subsystems with relatively large aberrations, for example aspheric optical systems, with the desired accuracy. The measurement task can also consist, for example, in measuring the actual deviation from a strongly aspheric desired wavefront, for example in the case of optical modules.

A lateral shearing interferometry technique is used in a refinement of this device. The dynamic range correction element is designed such that the second partial spatial derivatives of the wavefront to be determined are kept below a prescribable threshold value in the entire detection area, and this ensures the desired high dynamic range of the detection operation.

In a further refinement of this device, the dynamic range correction value is a computer-generated hologram element (CGH element) or another diffractive optical element (DOE) or an aspheric lens element. These correction elements can be designed such that the desired increase in dynamic range is achieved. When use is made of a CGH element, the local diffraction structure period thereof can be calculated with the aid of consideration of geometrical objects, preferably from a relatively simple analytical relationship.

In a development of the invention of advantageous design, a diffraction grating structure is provided on the front side of a common transparent carrier, and the dynamic range correction element is provided on the rear side thereof.

In a further aspect, for the purpose of solving the problem set, the invention includes a device for wavefront measurement of an optical system by means of a lateral shearing interferometry technique, having a mask structure element which can be positioned in the beam path upstream of the optical system, and a diffraction structure element which can be positioned in the beam path downstream of the optical system and has a periodic diffraction structure, and having a detector arrangement in the beam path downstream of the diffraction structure element for detecting an interference pattern of a wavefront, coming from the optical system, within a prescribable detection area. The device comprises a set of several diffraction structures, of different period lengths, and of corresponding mask structures of the mask structure element(s), in order to measure the optical system in various subareas of the detection area, or to measure the pupil with the aid of the diffraction structures of various period lengths and associated mask structures. This permits the selection of diffraction structure period lengths matched to the variation in the spatial characteristic of the interfering wavefront, and this corresponds to using various shearing distances for the shearing interferometry measurement in various subareas of the detection area. The measurement range dynamics of the device can be increased with the aid of this measure while maintaining a high measuring accuracy.

In a refinement of this device, at least for a first detection subarea a diffraction structure with a first period length is used, and for a second detection subarea with a wavefront phase modulation higher than in the case of the first detection subarea a diffraction structure with a greater period length than the first period length is used, it being possible thereby to increase the measurement dynamics in the desired way.

In an alternative aspect, in order to solve the problem set, the invention includes a device for wavefront measurement of an optical system by using a point diffraction interferometry technique, having a pinhole mask which can be positioned in the beam path upstream of the optical system, a beam splitting element, for example a diffraction grating element, a detector-side shadow mask structure for positioning in the beam path downstream of the optical system and which has a reference pinhole and a signal passage opening spaced apart therefrom, and having a detector arrangement in the beam path downstream of the detector-side shadow mask structure. The device comprises a set of several pairs of reference pinhole and signal passage openings, for example in various areas on a common shadow mask, on one dedicated shadow mask each, with various spacings of reference pinhole and signal passage openings, in order to measure the optical system in various subareas of the detection area or of the pupil with various such pairs of holes. It is possible with the aid of this measure to increase the measurement range dynamics of the point diffraction interferometer while maintaining a high measuring accuracy.

In a further aspect, the invention comprises a method for optical measurement of an optical system which comprises a detection of measuring radiation which comes from the optical system, and a determination and computational correction of a distortion error of the measuring radiation. The step of determining and computationally correcting the distortion error can be used to eliminate entirely or partially the influence of this error on the results of the measurement of the optical system. This comprises both applications in which a certain distortion error remains despite the use of a distortion correcting optics in a measuring device which carries out the method, and applications in which a relatively simple measuring optics is used and for this purpose the corresponding distortion error which is to be corrected computationally is accepted. The determination of the distortion error can be performed, for example, by calculating a distortion transformation by using a calculation of the optical beam path, for example by means of a corresponding ray-tracing algorithm, by an interferometric distortion error measurement by means of introducing reference patterns into a pupil, or a plane near the pupil, of a measuring optical imaging system, or into a plane conjugate therewith, or by a moiré measurement technique. A further advantageous distortion error determination includes a comparison of actual and desired positions of interference fringes of a generated and detected interference pattern when changing one or more external parameters. The change in the one or more external parameters particularly comprises a change in the position of a mask structure and/or a detector arrangement of the measuring device parallel to the main optical axis of the system, a change in the wavelength used and/or a change in the aberrations of the measured optical system, for example by adjusting existing xy-manipulators and/or z-manipulators for associated components of the measured system. The distortion is preferably corrected by applying the inverse distortion transformation after determining the distortion transformation describing the distortion error.

The method according to the invention can be used for the most varied measurement techniques, in particular for measurement by lateral shearing interferometry and by point diffraction inteferometry. The use of the distortion-correcting method permits, if desired, the use of a simplified optics for the measuring device. Moreover, the method permits a qualification of the quality of the measurement optics used such as, for example, a detector-side imaging optics.

In advantageous developments of the invention, an interferometric wavefront measurement of the optical system to be measured is carried out with the aid of the device according to the invention, that is to say by using the dynamic range correction element and/or a set of several diffraction structures of different period lengths during lateral shearing interferometry and/or a set of several image-side shadow mask structures with different spacings of reference pinhole and signal passage openings during point diffraction interferometry, in each case for various deflection subareas, and any distortion error is determined and corrected by the inventive method for determining distortion errors.

BRIEF DESCRIPTION OF THE DRAWINGS

Advantageous exemplary embodiments of the invention are illustrated in the drawings and will be described below. In the drawings.

DETAILED DESCRIPTION OF THE PREFERRED EMBODIMENTS

It is known that when measuring an optical imaging system by a lateral shearing interferometry technique that a modulation of intensity of the wavefront interference pattern formed is effected for a respective pixel (n, m) within a pupil of the imaging system by the lateral phase shifting, that is to say the lateral relative movement of object-side mask structure and image-side diffraction grating structure, and this modulation is proportional to a cosine function whose argument is equal to the sum of a spatially independent phase difference between mask and diffraction grating, and of a phase difference $\Delta\phi(x_n, y_m)$, dependent on the spatial coordinate $(x_n, y_m)$ of the pupil point (n, m) considered, between two different, interfering diffraction orders, for example a 0th and a +1th diffraction order. Given a phase-shifting shearing movement in an x-direction, for example, this phase difference $\Delta\phi(x_n, y_m)$ is yielded by the relationship $$\Delta\phi(x_n,y_m)=\phi(x_n+s,y_m)-\phi(x_n,y_m),$$

$\phi$ denoting the wavefront phase in the pupil plane, and s denoting the shearing distance for which the relationship, $s=\lambda f/\Lambda$ holds, $\lambda$ denoting the wavelength used, f denoting the focal length of the imaging system, and $\Lambda$ denoting the grating period of the diffraction grating.

As mentioned above, with the measuring device of type S-OI the pupil is measured in an undistorted fashion on a detector surface, for example of a CCD camera, while with the type C-OI the pupil is measured in a distorted fashion. However, for the C-OI the relationship between pupil coordinates and detector surface coordinates can be determined numerically or, in specific instances, also analytically. By detecting and evaluating the wavefront interference pattern, the measuring devices which operate using lateral shearing interferometry, such as the OI, do not directly detect the wavefront for the measured system, but the first spatial derivative thereof. The variation therein, that is to say the magnitude of the second partial spatial derivates of the wavefront, determines and limits the measurement range in which the measuring device can be used, which is therefore also denoted here as dynamic range. It is to be seen that a useful dynamic range can be defined, for example, by the condition $$\max\left(\frac{d^2\varphi(x,y)}{dx^2}\Delta x \cdot s, \frac{d^2\varphi(x,y)}{dy^2}\Delta y \cdot s\right) < q \cdot 2 \cdot \pi$$

for the second partial spatial derivates of the wavefront phase being satisfied for all wavefront points included, $\Delta x$ and $\Delta y$ denoting the extent of a pixel, and q denoting a limit value which is defined, in particular, by the evaluation method used and can typically be of the order of magnitude of 0.25, for example. The product, featuring in the above relationship, of the second wavefront derivative, pixel dimension and shearing distance is also denoted as phase modulation.

Figure 1:
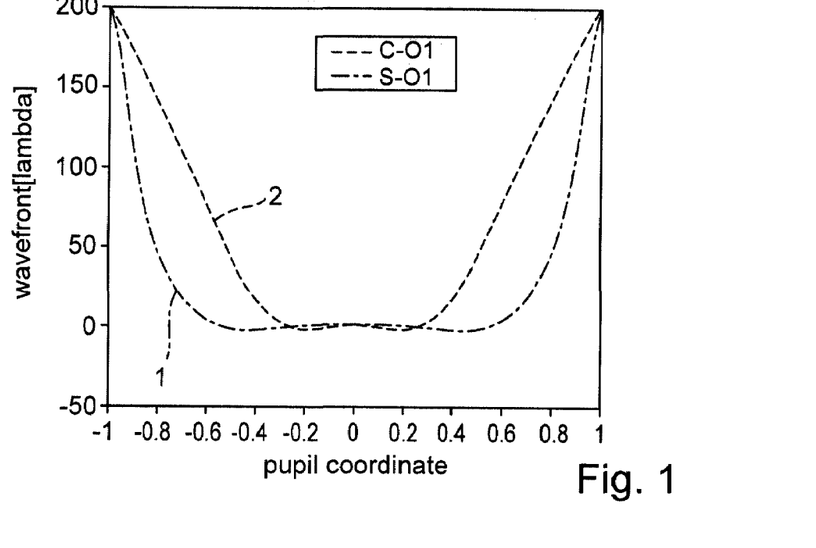
FIG. 1 shows a diagram of the typical characteristic of an interfering wavefront along a detector surface direction at the level of the detector plane for one measuring device each of type S-OI and C-OI when measuring a specific microlithography projection objective.
Figure 2:
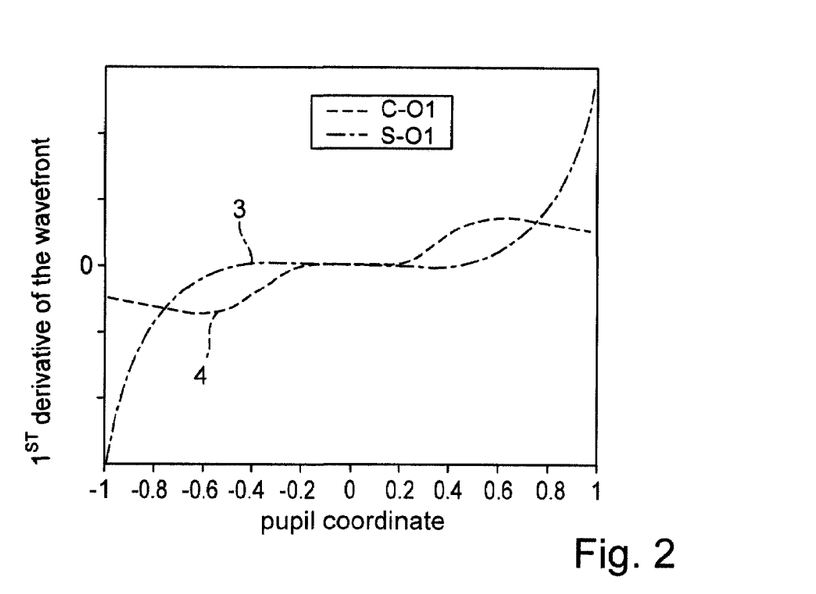
FIG. 2 shows a diagram of the characteristic of the gradient for the two wavefront characteristics of FIG. 1.
Figure 3:
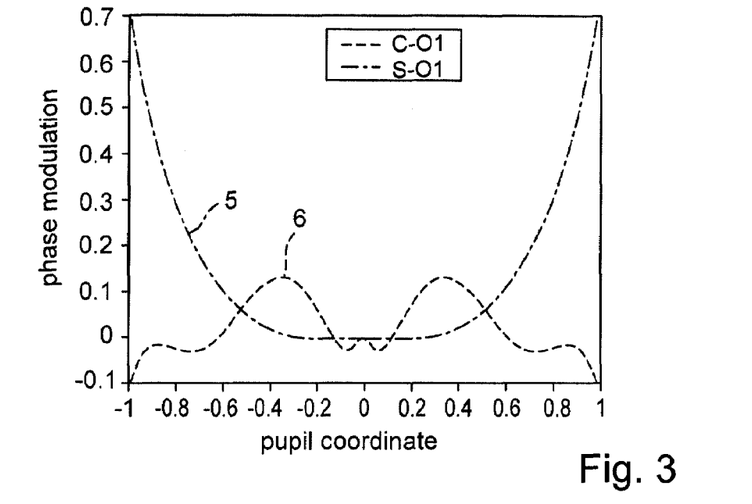
FIG. 3 shows a diagram of the characteristic of the second derivative of the two wavefront characteristics of FIG. 1.

These relationships are illustrated in FIGS. 1 to 3 diagrammatically for a specific example of the measurement of a microlithography projection objective having spherical aberration and a numerical aperture of approximately 0.9, specifically for the purposes of comparison, firstly for a measuring device of type S-OI and, secondly, for a measuring device of type C-OI. A pupil coordinate, for example that in the x-direction, normalized to an interval of [−1, +1], is plotted in each case on the abscissa in the diagrams of FIGS. 1 to 3. As shown in FIG. 1, in both instances the wavefront characteristic plotted on the ordinate in wavelength units rises sharply toward the pupil edge, but later for the S-OI (see associated curve 1) than for the C-OI (see associated curve 2). FIG. 2 shows qualitatively in corresponding characteristic curves 3 and 4 the associated characteristic of the first spatial derivative of the two characteristics 1, 2 of FIG. 1 for the S-OI and the C-OI, respectively. FIG. 3 shows in corresponding characteristic curves 5 and 6 the characteristic, proportional to the gradient of the two curves 3 and 4 of FIG. 2, of the wavefront phase modulation along the relevant direction for the S-OI and the C-OI, respectively.

As may be seen from FIG. 3, in this specific example the second derivative 5 rises sharply toward the pupil edge for the S-OI, and exceeds the above-mentioned limit value of, for example, $2\pi q = 2\pi/4$, which corresponds to $\lambda/4$, while the second derivative 6 remains within this bound for the C-OI. Consequently, in this specific example the C-OI makes use of the S-OI as the dynamic range of the measuring device over a relatively large number of detector surface pixels. The better utilization of the dynamic range also leads as a rule to a better accuracy of absolute measurement and to a better reproducibility in the case of a repeat measurement. The measurement will generally lead to other results as regards the utilization of the dynamic range for other examples of application, for example other measured objectives with other objective parameters. Depending on the case, the C-OI, as in the example of FIG. 3, or the S-OI can have a larger useful dynamic range.

Figure 4:
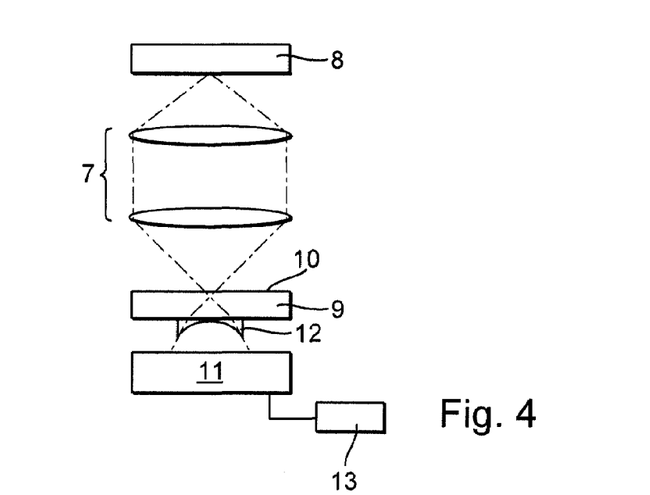
FIG. 4 shows a diagrammatic side view of a part of interest of a measuring device of type C-OI with an aspheric lens element as dynamic range correction element.
Figure 5:
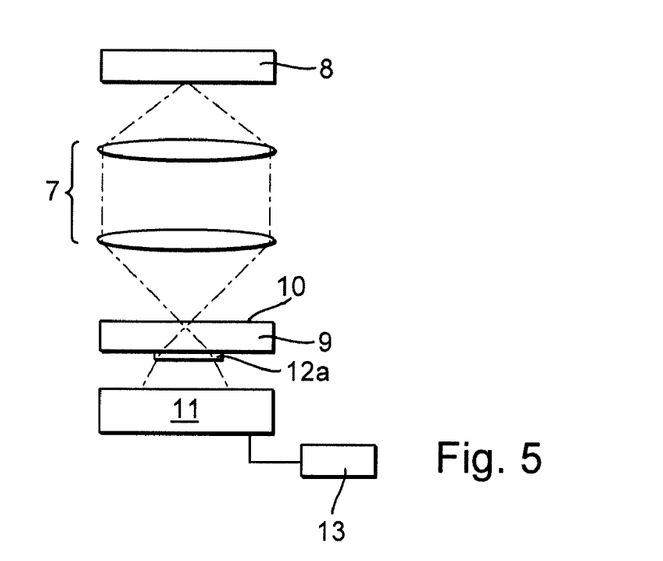
FIG. 5 shows a diagrammatic side view corresponding to FIG. 4, but with a CGH element as dynamic range correction element.
Figure 6:
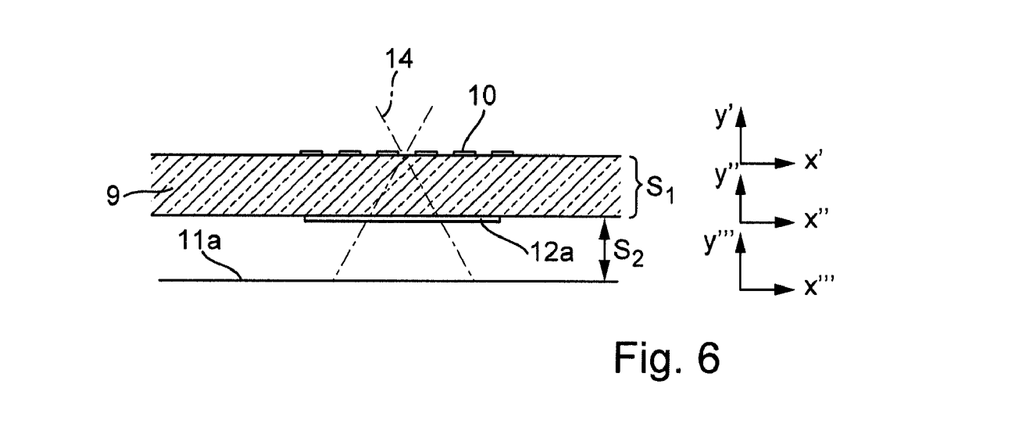
FIG. 6 shows a detailed view of FIG. 5 with the CGH element and a diffraction grating structure on a common carrier.

FIGS. 4 to 6 illustrate additional measures with the aid of which the useful dynamic range can be increased by using a dynamic range correction element with the measuring device of type C-OI.

The C-OI shown in FIG. 4 is of conventional design for measuring, for example, a microlithography projection objective 7. Specifically, the C-OI of FIG. 4 includes a mask element 8 with a mask structure which can be positioned in an object plane of the objective 7, a transparent substrate carrier 9, on the front side of which there is constructed a conventional diffraction grating structure 10 which is positioned in an image plane of the measured lens 7, and a detector arrangement 11, for example a CCD camera. Connected to the detector arrangement 11 is an evaluation unit 13 which evaluates the detection information supplied by the detector arrangement 11 in order to reconstruct by computation the wavefront for the measured objective 7, and thus to be able to make a statement on the imaging quality or aberration of the objective 7.

Fitted on the rear side of the substrate carrier 9 is an aspheric lens element 12 which is specifically designed as a dynamic range correction element. This means that the design of this aspheric lens element 12 is calculated and implemented such that it influences the wavefront beam path so as to increase the dynamic range, that is to say the aspheric lens element 12 is designed such that it ensures that the characteristic of the second partial spatial derivates of the wavefront characteristic is smoothed out within a pupil of the measured objective 7. By comparison with a C-OI of conventional design without the aspheric lens element 12, the C-OI of FIG. 4 therefore has a larger dynamic range with the above named advantages which are yielded by the distribution of the dynamic range which is detected thereby and is as uniform as possible, within a detection area considered, such as the pupil of the objective 7.

FIG. 5 shows a C-OI as a variant of the device of FIG. 4, the C-OI of FIG. 5 including a computer generated hologram element (CGH element) 12a as dynamic range correction element instead of the aspheric lens element 12 of FIG. 4. Otherwise, the C OI of FIG. 5 corresponds to that of FIG. 4, identical reference numerals being selected for the purpose of explanation of functionally equivalent but not necessarily identical components. It goes without saying that, depending on the application, the C-OI of FIG. 4 or of FIG. 5 can comprise further components (not shown) which are of no further interest here.

By an analogy with the above explanations, the CGH element is de-signed with reference to the aspheric lens element 12 of FIG. 4 such that it distributes as uniformly as possible the dynamic range of the measuring device, which is determined by the second partial spatial wavefront derivates, within the pupil of the measured objective 7, such that it increases the useful dynamic range. The CGH element can be generated in a customary way for the fabrication of such optical elements, there being used for the desired effect as dynamic range correction element a few specific design steps which will be examined in more detail below with reference to FIG. 6.

FIG. 6 shows in more detail that in this example the diffraction grating structure 10 and the CGH element 12a are fitted jointly on the transparent substrate carrier 9, specifically the diffraction grating structure 10 on its front side, at the top of FIG. 6, and the CGH element 12a on its rear side, at the bottom of FIG. 6. Interfering wavefront radiation 14 is diffracted at the diffraction grating structure 10, penetrates through the transparent substrate carrier 9 and is then influenced by the CGH element 12a to increase the dynamic range before it falls onto a sensitive detector surface 11a of the detector arrangement and is detected there as an interference pattern. A material having low absorption and good mechanical properties, in particular high stability, is preferably used for the substrate carrier 9. For the sake of simplicity, the following explanation of the steps for designing the CGH element 12a is restricted to one dimension, that is to say an x-coordinate, and to a symmetrical course of the wavefront such as, for example, in the case of defocusing effects and spherical aberrations. The mode of procedure is shown in an appropriately modified form for the two-dimensional case, as well. For the purpose of better comprehension, an x' coordinate is specified in a plane upstream of the substrate carrier 9, an x"-coordinate in a plane downstream of the substrate carrier 9, and an x'" coordinate in a plane of the detector surface 11a.

The first step is to use the relationship $$\Delta \phi_p = 2\Delta \phi_{max}|p/P - 0.5|, \text{ where } 0 \geq p \geq P$$

to select target phases $\Delta \phi_p$ in the plane of the detector surface 11a for the design of the CGH element 12a. Here, $\Delta \phi_{max}$ denotes the achievable maximum value of the phase, while P denotes the number of detector surface pixels along the x'"-coordinate, and p denotes the pixel running variable. Subsequently, interpolation points x" satisfying the condition $\Delta \phi_p(x") = \Delta \phi_p$ are calculated in the plane downstream of the substrate carrier 9, that is to say at the level of the CGH element 12a. In a next step, interpolation points x'" with $\Delta \phi_p(x'") = pX/P - X/2$ are defined in the detector surface plane, X being the assumed diameter of the wavefront radiation on the plane of the detector surface 11a. The structure of the CGH element is then calculated such that it is used to transfer the interpolation points in the x'''-plane of the CGH element into the interpolation points in the x'''-plane of the detector surface 11a. The local varying grating period $\Lambda_L$ can be calculated for this purpose from the relationship below, in the following way:

$$\Lambda = \frac{\lambda}{\sin(\arctan(x'_p/s_1)) - \sin(\arctan((x'''_p - x''_p)/S_2))},$$

$s_1$ denoting the thickness of the substrate carrier 9, and $s_2$ denoting the spacing between the substrate carrier 9 or CGH element 12a and the detector surface 11a, as indicated in FIG. 6.

Figure 7:
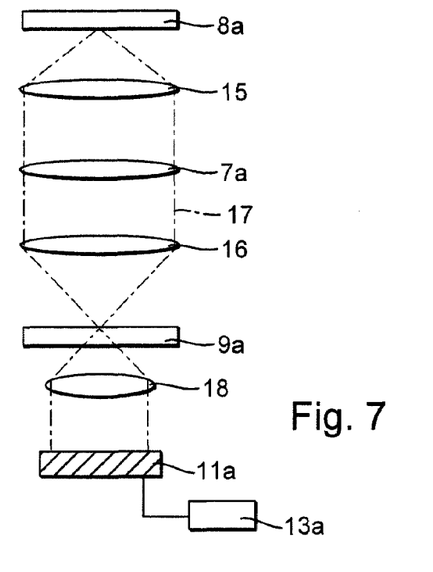
FIG. 7 shows a diagrammatic side view of a part of interest of a measuring device of type S-OI with additional lens elements for parallelizing the beam path for the optical system to be measured.

FIG. 7 shows a measuring device of the S-OI type, specifically in a design for measuring an aspheric lens 7a. For the purpose of improved measurement of the aspheric lens 7a, the S-OI of FIG. 7 comprises a lens 15 positioned upstream thereof, and a lens 16 positioned downstream thereof. The two auxiliary lenses 15, 16 provide a parallelized beam path 17 in which the aspheric lens 7a to be tested is located. Moreover, as usual the S-OI includes an object-side mask structure element 8a with a mask structure to be positioned in an object plane of the system, an image-side diffraction structure element with a diffraction grating structure to be arranged in an image plane of the system, and a downstream microscope objective 18 for imaging the far field of the wavefront interference pattern onto the detector surface of a detector arrangement 11a, whose detection information is evaluated by a downstream evaluation unit 13a for the purpose of reconstructing the wavefront for the lens 7a to be tested. In order to determine the aberrations of the lens 7a to be tested, the aberrations of the optical system formed by the two auxiliary lenses 15 and 16 are worked out by calculation.

The invention also comprises the provision of a measuring device which operates by means of lateral shearing interferometry and in the case of which the dynamic range is extended by the use of several mask/diffraction structures with different period lengths and, therefore, different shearing distances. For various areas of a pupil of an imaging system to be measured, use is made in this case of several combinations of mask structures and diffraction structures in the case of which the diffraction structures have different period lengths, something which consequently corresponds to different shearing distances. The shearing distance decreases with a greater diffraction structure period length, and as a result the dynamic condition specified above permits higher values for the second partial spatial derivatives of the wavefront phase. It is possible in this way to keep the wavefront modulation below the prescribed limit value of λ/4, for example, throughout the entire pupil. Otherwise, it is possible to use a conventional design of the measuring device, for example of the S-OI type in accordance with FIG. 7, with or without the auxiliary lenses 15, 16 there, of the C-OI type in accordance with FIG. 4.

Figure 8:
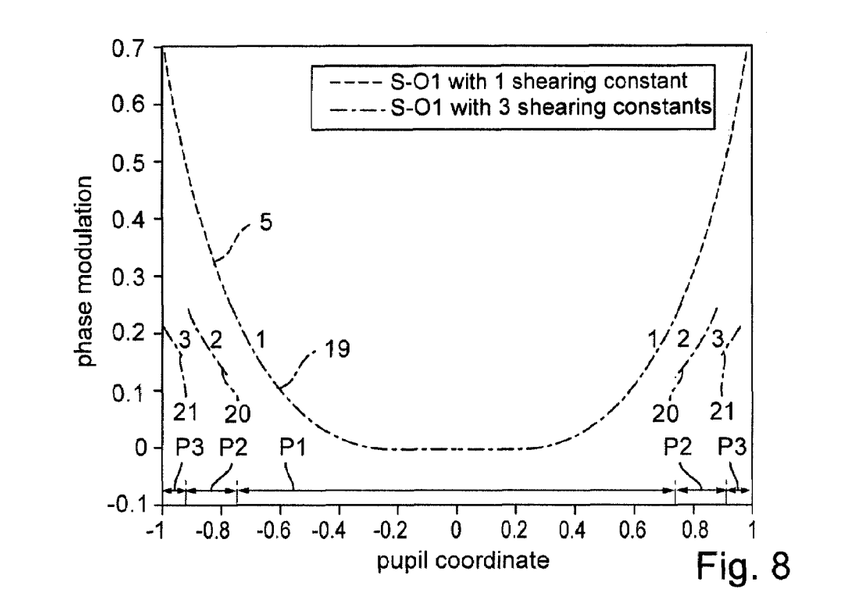
FIG. 8 shows a diagram for illustrating a phase modulation characteristic of an interfering wavefront to be detected, at the level of a detector plane during measurement of a microlithography projection objective with the aid of an S-OI measuring device by using several different diffraction structure periods for various shearing distances by comparison with the use of only one diffraction structure period.

FIG. 8 illustrates diagrammatically such an exemplary embodiment, in which the dynamic range for a measuring device of S-OI type is ex-tended by using three different mask/diffraction structures. A comparative example is provided by the S-OI explained above in relation to FIGS. 1 to 3, which operates with a fixed diffraction structure period length and consequently with a single shearing distance, also denoted as shearing constant in the insert of FIG. 8, and which belongs to the characteristic curve 5 in accordance with FIG. 3, which exceeds the prescribed limit value of, for example, λ/4 towards the pupil edge.

Specifically, the S-OI in accordance with FIG. 8 makes use within a relatively large central pupil area P1 whose normalized pupil coordinate extends approximately from −0.75 to +0.75, of a diffraction grating structure with a first period length and a mask structure with a corresponding period length such that with the associated shearing distance the phase modulation also still does not exceed the pre-scribed limit value of λ/4, for example, towards the marginal area of this pupil coordinate interval P1, see the associated phase modulation curve 19. In a pupil area P2 adjoining the out-side, in accordance with FIG. 8 the S-OI uses a second diffraction grating structure with a second period length greater than the first period length, and a second mask structure with a period length corresponding thereto. The second diffraction structure period length, which is greater than the first, signifies a second shearing constant, which is smaller than the first shearing constant used for the central pupil area P1 and is selected such that the associated phase modulation curve 20 remains below the pre-scribed limit of λ/4, for example, within the associated pupil subarea P2, as illustrated in FIG. 8. In an external pupil subarea P3, in accordance with FIG. 8 the S-OI uses a third combination of diffraction and mask structures with a third diffraction structure period length which is greater than the second one, and the corresponding mask structure period length, and therefore with a third shearing constant which is smaller than the second one. The result of this is that even in this external pupil subarea P3 the phase modulation, which is proportional to the product of the second wave-front derivative and the shearing distance—as explained with the aid of above dynamic range condition, can also be kept below the prescribed limit value of λ/4, for example. The three different shearing constants for the S-OI in accordance with FIG. 8 can be selected in the ratio of 1:2:3, for example, that is to say the second shearing constant for the pupil subarea P2 is half as large as the first shearing constant for the central pupil area P1, and the third shearing constant for the external pupil subarea P3 is only one third as large as the first shearing constant.

Overall, a measurement operation with the aid of the S OI in accordance with FIG. 8 yields three wavefront subareas for the three pupil subareas P1, P2 and P3, which are then combined with one another to re-construct the entire wavefront, for which purpose the wavefront subareas are matched to one another at the transitions in particular. For this purpose, a matching algorithm which is conventional per se, for example, is used to approximate the wavefront subareas, obtained by the shearing operation, in the individual pupil subareas P1, P2 and P3 by a prescribable function set with free coefficients which are then determined by the method of least error squares or another conventional matching method such that the targeted wavefront, resulting from the shearing operation, is obtained for the entire pupil area, that is to say the entire detection area.

Figure 9:
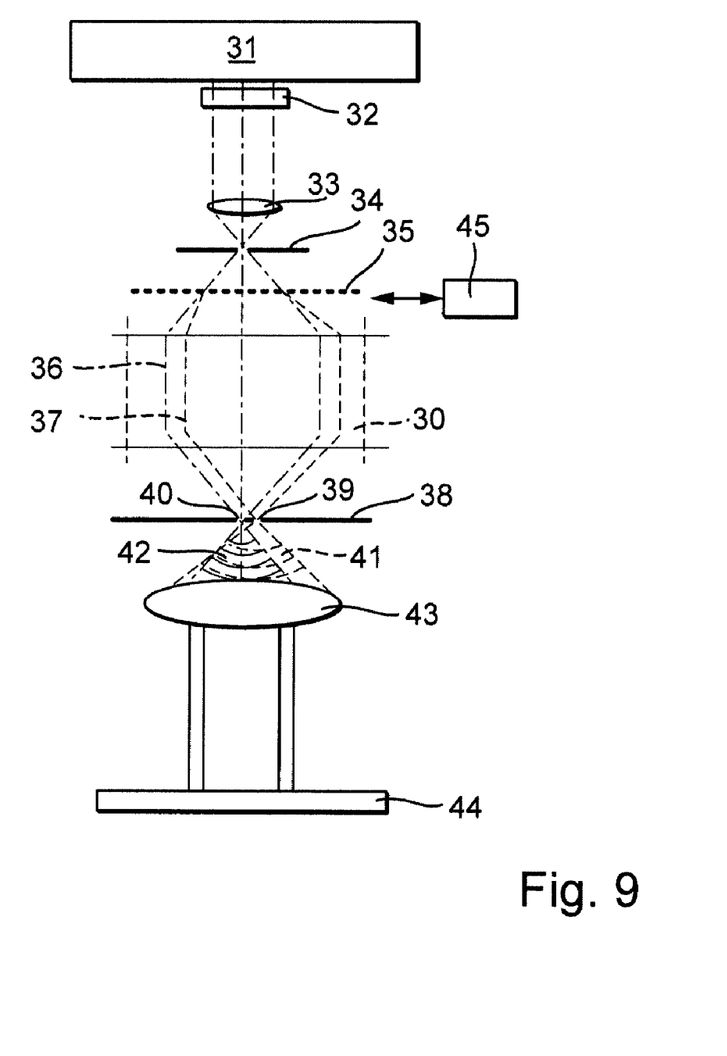
FIG. 9 shows a diagrammatic side view of a part of interest of a measuring device of the point-diffraction interferometry type, in which several pairs of reference pinhole and signal pas-sage openings with different spacings are used on the detector side to increase the measurement range dynamics.

FIG. 9 shows a diagram of a measuring device which operates using point diffraction interferometry and whose dynamic range is extended by analogy with the above S-OI example of FIG. 8 by using different detector-side shadow mask structures. The point diffraction interferometer (PDI) device of FIG. 9 serves for measuring an optical imaging system 30, for example a microlithography projection objective, and is of a design customary for this purpose, having a source 31 for measuring radiation, for example an illuminating system of a microlithography projection exposure machine which is followed in the beam path of the measuring radiation up to the imaging system 30 to be measured by a diffusing screen 32, a spot lens 33, a pinhole mask 34 and a beam-splitting element, here a diffraction grating 35. The diffusing screen 32 provides spatially sufficient incoherent radiation. The pinhole mask 34 has a so-called pinhole, which is under-stood here as an opening of so small a diameter that the same acts as a point light source for the measuring radiation. By diffraction, the diffraction grating 35 splits the spherical wave generated by the pinhole mask 34 into a measuring signal wave 36 and a reference wave 37. The two partial waves traverse the imaging system 30 to be measured on similar trajectories.

Arranged in the beam path downstream of the imaging system 30, preferably in or near the image plane of the imaging system 30, is a detector-side shadow mask 38 which has a reference pinhole 39 and a signal passage opening 40. The imaging system 30 images the reference wave 37 onto the reference pinhole 39 such that a spherical reference wave 41 emanates from the latter. The signal passage opening 40 is arranged at a prescribable spacing from the reference pinhole, and has a larger diameter than the pinhole in such a way that the measuring signal wave 36 focused onto it by the imaging system 30 can penetrate as measuring signal wave 42 without a significant diffraction effect. The measuring signal wave 42 interferes with the reference wave 41, which is coherent with it, and the desired measuring information can be obtained from the interference pattern produced. For detection purposes, the interference pattern is imaged by means of a microscope objective 43 onto a detector 44, for example a CCD camera. The phase shift method, in which the diffraction grating 35 is displaced laterally by means of an associated actuator unit 45, can be used to increase the measuring accuracy.

A set of several pairs of reference pinhole 39 and signal passage opening 40 with different spacings in between the reference pinhole 39 and the signal passage opening 40 are provided for the PDI device of FIG. 9 in order to extend the measuring area dynamics. This plurality of pairs of holes with a different spacing of reference pinhole 39 and signal passage opening 40 can be provided in various areas of a single shadow mask element 38, or use is made alternatively of several exchangeable shadow mask elements 38, each having one or more such pairs of holes. In a way similar to the use, explained above, of various mask/diffraction structures with different period lengths during lateral shearing interferometry, the use of several pairs of reference pinhole 39 and signal passage opening 40 with different hole spacings permits the dynamic modulation to be matched to the respective wavefront area. In other words, it is possible, for example, in a situation corresponding to FIG. 8 to make use for the central pupil area P1 of a first pair of reference pinhole 39 and the signal passage opening 40 with a first hole spacing, to make use for the pupil subarea P2, adjoining on the outside, of a second pair of holes with a second hole spacing smaller than the first one, and to make use for the outer pupil subarea P3 of a third pair of holes with a third hole spacing smaller than the second one. The result of this is an analogous effect which increases the measurement area dynamics, as was explained above in relation to FIG. 8. Of course, depending on what is required it is also possible to use only two or more than three such pairs of holes with different hole spacings.

The method, explained in relation to FIGS. 8 and 9, of using several diffraction structures of different period length during shearing interferometry, or using several pairs of reference pinhole and signal passage openings with different spacings during point diffraction interferometry, can be combined with the method, explained in relation to FIGS. 4 to 6, of using a dynamic range correction element, in order to increase the dynamic range of a measuring device operating with lateral shearing interferometry or point diffraction interferometry. In the case of the first mentioned method, the phase modulation is kept sufficiently low in areas with a relatively high second wavefront derivative by using matched relatively small shearing distances or matched relatively small spacings between reference pinhole and signal passage opening, while in the last-named method the second wavefront derivative is reduced by the action of the dynamic range correction element. Apart from an aspheric lens and a CGH element, it is also possible to use as dynamic range correction element another diffractive optical element (DOE) of suitable design.

Whereas in the case of the S-OI the generated wavefront interference pattern is imaged in a sinusoidally corrected fashion into the far field onto the detector by using a special detector-side imaging optics such as a microscope objective and, if required, a relay optics, and is thus already largely corrected in terms of distortion, in the case of the C-OI no such complex measuring optics is used, and a distortion is accepted instead of this, as explained above. When use is made of the dynamic range correction element, the distortion is also a function of the latter. Depending on the detection system used, the latter possibly also contributes to the distortion error. For these measuring devices, it is desirable to consider distortion errors in a corrective and/or calibrating fashion. The invention comprises the measure of determining, if required, the distortion error for the measuring device computationally and/or in a special way by measurement, and of taking it into account in the wavefront reconstruction. Several procedures are suitable for this purpose.

A first method for the distortion correction includes a computational determination of a distortion transformation, that is to say a mathematical transformation function which images the distortion error of, for example, a pupil plane of a measured optical imaging system onto the plane of the detector surface by means of optical computation. Optical computing methods known per se, such as so-called ray tracing, can be used for this purpose. The geometrical initial variables required for the calculation, such as distances, radii etc can be determined for the individual components mechanically or with the aid of optical measuring technology. After the distortion transformation has been calculated, the system-induced distortion can be corrected by using the inverse distortion transformation onto the detected wavefront interference pattern or the wavefront derivatives obtained therefrom.

A second distortion correction method includes introducing prescribed reference patterns into a pupil, or a plane near the pupil, of a measuring optical imaging system, or in or near a plane conjugate therewith, as in a plane, near the pupil, of an illuminating system which is positioned upstream of a measured projection objective of a microlithography projection exposure machine. The respective reference pattern is then imaged onto the detector surface by the measured imaging system and the optionally present detector-side imaging optics of the measuring device, such that the distortion error of the measuring device can be determined by comparing the image of the reference pattern on the detector surface with the original reference pattern. This presupposes that the distortion of the system to be measured is known or can be neglected. It is possible to measure a distortion in situ, if necessary, by exchanging the substrate carrier bearing the image-side diffraction structure by an uncoated substrate.

A third possible method for distortion error correction consists in determining the distortion with the aid of a moiré measuring technique. For this purpose, a first moiré structure is arranged in a pupil or a plane near the pupil of a measured optical imaging system or in a plane conjugate therewith, and a second moiré structure is arranged in the beam path downstream of the measured system, and the moiré superimposition structure is detected by the detector. Given a known distortion of the measured system, it is then possible to determine the distortion error therefrom for the measurement. With this method, as well, it is possible to measure distortion in situ by means of exchanging the substrate carrier bearing the diffraction structure in the measurement operation for a non-coated substrate.

A fourth method for distortion correction consists in calculating a distortion function by desired/actual comparison of interference fringes of the generated interference pattern, that is to say to compare the actual position of interference fringes on the detector surface with computational desired positions in several different measurement settings. In this case, one or more external parameters are changed for the various measurement set-tings in order in this way to minimize the error when calculating the distortion transformation. The change in the external parameter or parameters includes, for example, a change in the z-position, that is to say the axial position along a main optical axis of the system, in the detector arrangement and/or in an object-side mask structure element, a change in the wavelength used and/or a change in the aberrations of a measured optical imaging system by adjusting xy- and/or z-manipulators present in this imaging system, for example in the case of a microlithography projection objective.

The information required for the distortion correction of the pupil image in the detector plane can be obtained using the said methods. The use of such a distortion correction method for measuring devices of S-OI type also permits a quality qualification of the detector-side imaging optics used. It is obvious that the abovementioned method for determining the distortion transformation and for the appropriate distortion correction by using the inverse distortion transformation can be used not only with lateral shearing interferometers, but also with other wavefront measurement devices, for example for point diffraction interferometers. It is advantageous, in particular, to combine an inventive measurement in the case of a high dynamic range by using the dynamic range correction element and/or several shearing interferometry diffraction structures of various periodic lengths and/or several pairs of reference pinhole and signal passage openings in the case of a point diffraction interferometer, in each case for various detection areas and/or pupil subareas, with an inventive distortion correction.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. A method for optical measurement of an optical system, comprising:

detecting measuring radiation coming from the optical system, and determining a distortion error by determining a distortion function from a comparison of detected actual positions of interference fringes with computational desired positions when changing one or more external parameters, the change in the at least one external parameter comprising at least one of a change in the position of a detector arrangement or of a mask structure of a measuring device parallel to a main optical axis, a change in the wavelength of the measuring radiation, and a change in aberrations through adjustment of xy-manipulators or z-manipulators of the measured optical system.

2. The method according to claim 1, wherein the optical measurement is carried out by an interferometric wave-front measurement technique.

3. The method according to claim 2, wherein the interferometric wave-front measurement comprises:

placing a detector arrangement in the beam path downstream of the optical system in order to detect a generated interference pattern of a wavefront within a detection area, and placing a dynamic range correction element in the beam path up-stream of the detector arrangement, which element is designed for keeping a variation in a spatially dependent characteristic of a phase of the wavefront forming the interference pattern below a prescribed limit value throughout the detection area.

4. The method according to claim 2, wherein the interferometric wavefront measurement comprises a measurement by means of lateral shearing interferometry comprising:

positioning at least one mask structure element in the beam path upstream of the optical system, positioning at least one diffraction structure element with at least one periodic diffraction structure in the beam path downstream of the optical system, and positioning a detector arrangement in the beam path downstream of the diffraction structure element in order to detect a generated interference pattern of a wavefront within a detection area, wherein a set of several diffraction structures of different period lengths are used on the at least one diffraction structure element, and a set of corresponding mask structures are provided on the at least one mask structure element, in order to measure the optical system with the aid of diffraction structures of different period lengths for at least two different sub-areas of the detection area.

5. The method according to claim 2, wherein the interferometric wavefront measurement comprises a measurement by means of point diffraction interferometry comprising:

positioning a pinhole mask in the beam path upstream of the optical system, positioning at least one detector-side shadow mask with at least one pair of a reference pinhole and a signal passage opening spaced apart therefrom in the beam path downstream of the optical system, and positioning a detector arrangement in the beam path downstream of the detector-side shadow mask in order to detect a generated interference pattern of a wavefront within a detection area, wherein a set of several pairs of reference pinhole and signal passage opening with different spacings of reference pinhole and signal passage opening are used in order to measure the optical system with the aid of pairs of holes with a different spacing of reference pinhole and signal passage opening for at least two different sub-areas of the detection area.

6. A method for optical measurement of an optical system, comprising:
   detecting measuring radiation coming from the optical system, and
   determining and computationally correcting a distortion error of the detected measuring radiation,
   wherein the distortion error is determined by calculating a distortion transformation by means of a calculation of the optical beam path or by a distortion measurement by means of introducing reference patterns into a pupil, or a plane near the pupil, of a measuring optical imaging system, or into a plane conjugate therewith, or by a distortion measurement by means of moiré structures or by determining a distortion function from a comparison of detected actual positions of interference fringes with computational desired positions when changing one or more external parameters, the change in the at least one external parameter comprising at least one of a change in the position of a detector arrangement or of a mask structure of a measuring device parallel to a main optical axis, a change in the wavelength of the measuring radiation, or a change of aberrations by adjusting xy-manipulators or z-manipulators of the measured optical system, and
   wherein a distortion transformation describing the distortion error is determined by at least one of measurement and computation, and the distortion error is corrected computationally by applying the inverse distortion transformation.

7. The method according to claim 6, wherein the optical measurement is carried out by an interferometric wave-front measurement technique.

8. The method according to claim 7, wherein the interferometric wavefront measurement comprises a measurement by means of lateral shearing interferometry comprising:
   positioning at least one mask structure element in the beam path upstream of the optical system,
   positioning at least one diffraction structure element with at least one periodic diffraction structure in the beam path downstream of the optical system, and
   positioning a detector arrangement in the beam path downstream of the diffraction structure element in order to detect a generated interference pattern of a wavefront within a detection area,
   wherein a set of several diffraction structures of different period lengths are used on the at least one diffraction structure element, and a set of corresponding mask structures are provided on the at least one mask structure element, in order to measure the optical system with the aid of diffraction structures of different period lengths for at least two different sub-areas of the detection area.

9. The method according to claim 7, wherein the interferometric wavefront measurement comprises a measurement by means of point diffraction interferometry comprising:
   positioning a pinhole mask in the beam path upstream of the optical system,
   positioning at least one detector-side shadow mask with at least one pair of a reference pinhole and a signal passage opening spaced apart therefrom in the beam path downstream of the optical system, and
   positioning a detector arrangement in the beam path downstream of the detector-side shadow mask in order to detect a generated interference pattern of a wavefront within a detection area,
   wherein a set of several pairs of reference pinhole and signal passage opening with different spacings of reference pinhole and signal passage opening are used in order to measure the optical system with the aid of pairs of holes with a different spacing of reference pinhole and signal passage opening for at least two different sub-areas of the detection area.

10. The method according to claim 7, wherein the interferometric wave-length measurement comprises:
    placing a detector arrangement in the beam path downstream of the optical system in order to detect a generated interference pattern of a wavefront within a detection area, and
    placing a dynamic range correction element in the beam path up-stream of the detector arrangement, which element is designed for keeping the variation in the spatially dependent characteristic of a phase of the wavefront forming the interference pattern below a prescribed limit value throughout the detection area.

11. The method according to claim 10, wherein the interferometric wavefront measurement comprises a measurement by means of lateral shearing interferometry comprising:
    positioning at least one mask structure element in the beam path upstream of the optical system,
    positioning at least one diffraction structure element with at least one periodic diffraction structure in the beam path downstream of the optical system, and
    positioning a detector arrangement in the beam path downstream of the diffraction structure element in order to detect a generated interference pattern of a wavefront within a detection area,
    wherein a set of several diffraction structures of different period lengths are used on the at least one diffraction structure element, and a set of corresponding mask structures are provided on the at least one mask structure element, in order to measure the optical system with the aid of diffraction structures of different period lengths for at least two different sub-areas of the detection area.

12. The method according to claim 10, wherein the interferometric wavefront measurement comprises a measurement by means of point diffraction interferometry comprising:
    positioning a pinhole mask in the beam path upstream of the optical system,
    positioning at least one detector-side shadow mask with at least one pair of a reference pinhole and a signal passage opening spaced apart therefrom in the beam path downstream of the optical system, and
    positioning a detector arrangement in the beam path downstream of the detector-side shadow mask in order to detect a generated interference pattern of a wavefront within a detection area,
    wherein a set of several pairs of reference pinhole and signal passage opening with different spacings of reference pinhole and signal passage opening are used in order to measure the optical system with the aid of pairs of holes with a different spacing of reference pinhole and signal passage opening for at least two different sub-areas of the detection area.

13. The method according to claim 2, wherein the interferometric wave-front measurement technique is one of a lateral shearing interferometry technique and a point diffraction interferometry technique.

14. The method according to claim 7, wherein the interferometric wave-front measurement technique is one of a lateral shearing interferometry technique and a point diffraction interferometry technique.

* * * * *